United States Patent [19]

Gattuso

[11] Patent Number: 4,480,585
[45] Date of Patent: Nov. 6, 1984

[54] EXTERNAL ISOLATION MODULE

[75] Inventor: David A. Gattuso, Pontiac, Mich.

[73] Assignee: Energy Conversion Devices, Inc., Troy, Mich.

[21] Appl. No.: 506,960

[22] Filed: Jun. 23, 1983

[51] Int. Cl.³ .............................................. C23C 13/10
[52] U.S. Cl. .................... 118/719; 118/718; 118/733; 118/900; 277/DIG. 7
[58] Field of Search ............... 118/733, 718, 719, 723, 118/50.1, 900; 34/242; 427/255.5; 277/DIG. 7

[56] References Cited

U.S. PATENT DOCUMENTS

| | | | |
|---|---|---|---|
| 2,887,984 | 5/1959 | Drummond | 118/718 |
| 2,975,753 | 3/1961 | Hayes | 118/718 |
| 3,294,670 | 12/1966 | Charschan et al. | 118/719 X |
| 4,048,955 | 9/1977 | Anderson | 118/69 X |
| 4,065,137 | 12/1977 | Rueggeberg et al. | 34/242 X |
| 4,268,977 | 5/1981 | Geiger | 34/242 |

Primary Examiner—John D. Smith
Assistant Examiner—Bernard F. Plantz
Attorney, Agent, or Firm—Marvin S. Siskind; Ronald W. Citkowski

[57] ABSTRACT

An external isolation module adapted to operatively interconnect at least one pair of a plurality of adjacent vacuum chambers through which a substrate travels and into which reaction materials are introduced. The external isolation module provides a passageway for the substrate between adjacent chambers while substantially preventing the diffusion of reaction materials from one of the chambers into the adjacent chamber. An accessible, environmentally-sealed, reaction material-isolating passageway is thereby formed.

21 Claims, 6 Drawing Figures

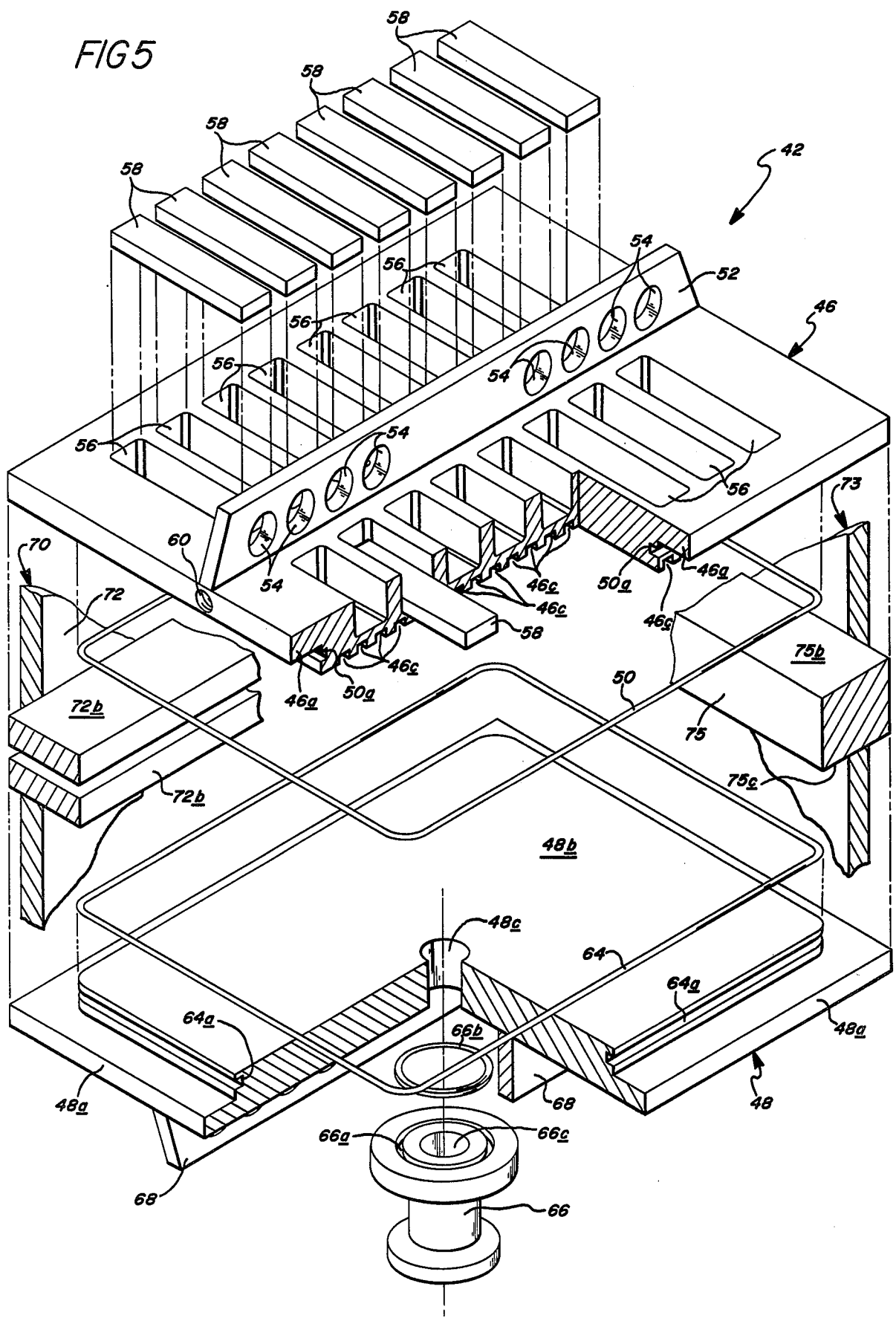

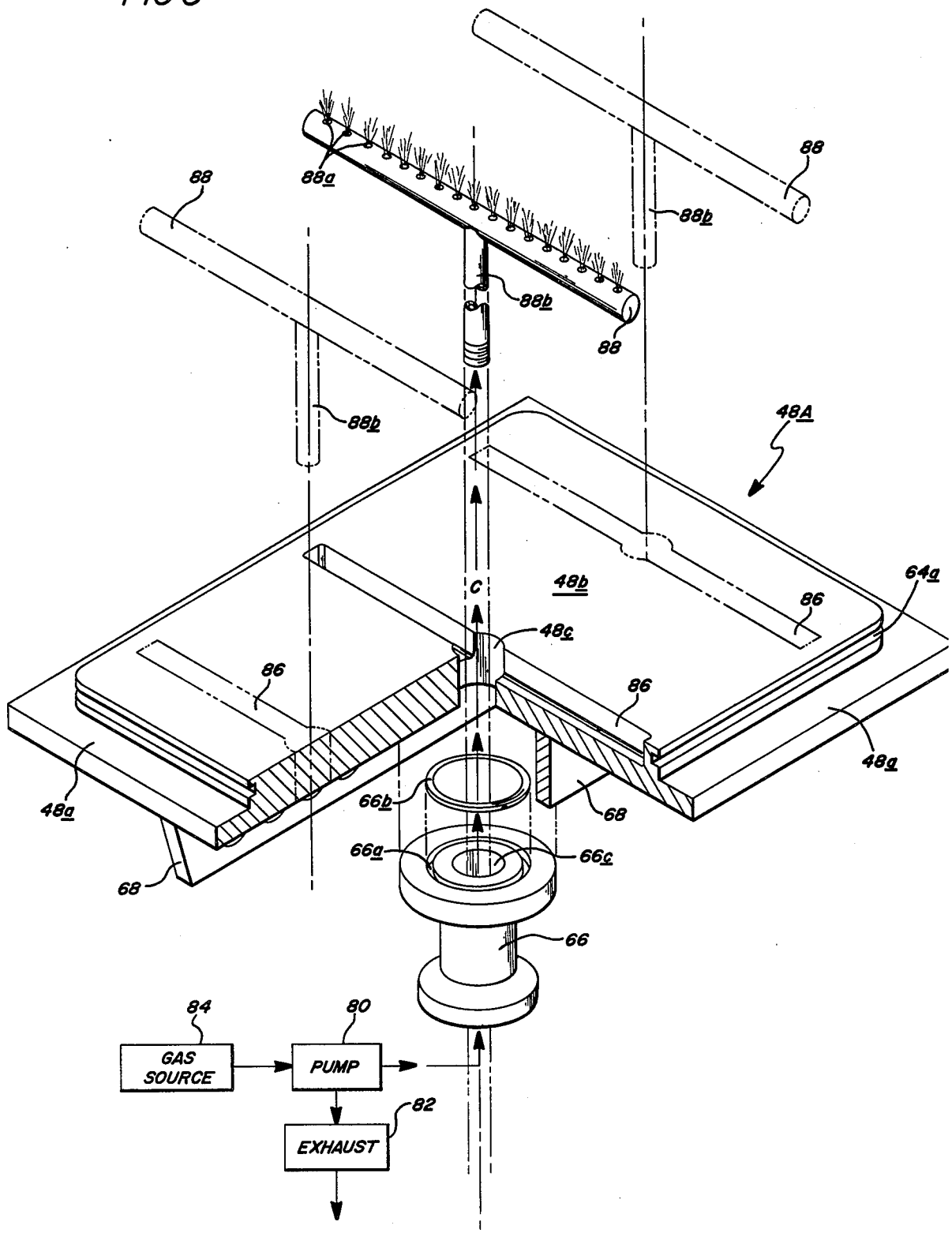

EXTERNAL ISOLATION MODULE

FIELD OF THE INVENTION

This invention relates generally to apparatus for producing improved photovoltaic devices and more particularly to an external isolation module for operatively interconnecting a pair of adjacent deposition chambers so as to (1) substantially prevent reaction materials from one of the chambers from diffusing into and contaminating the reaction materials in the adjacent chamber, and (2) provide an accessible, environmentally-sealed passageway between those adacent chambers.

BACKGROUND OF THE INVENTION

This invention relates to apparatus for continuously producing photovoltaic devices by depositing successive layers of semiconductor material onto a substrate as that substrate travels through at least two operatively interconnected, dedicated deposition chambers. The composition of the semiconductor layers deposited onto the substrate in each deposition chamber is dependent upon, inter alia, the particular reaction gas(es) introduced into that deposition chamber. The deposition chambers are interconnected by a relatively narrow isolation passageway (1) through which the substrate passes, and (2) which is adapted to isolate the reaction gas(es) introduced into each of the adjacent deposition chambers. Previous isolation passageways (also referred to as gas gates) which the assignee of the instant invention developed, were operatively disposed internally of one of the pair of adjacent deposition chambers. However, such internal disposition of the gas gate passageway creates difficulties when it is necessary to gain access to the interior of that passageway, for such purposes as cleaning, leak testing, modifying the passageway, etc. Access can only be obtained by (1) opening the deposition chamber in which the gas gate passageway is housed, and (2) dismantling the deposition components of the chamber as well as the complex sealing mechanism of the gas gate passageway itself. Obviously, in order to restore the apparatus to an operational state, the gas gate passageway must then be reassembled, sealed and leak-checked. Only then can the deposition chamber be closed to the environment and prepared for resumption of the deposition process.

The importance of thoroughly sealing the isolation passageway is becoming increasingly apparent. Any leakage of environmental contaminants into the deposition chambers results in the deposition of semiconductor material onto the substrate which exhibits chemical characteristics and electrical properties inferior to those chemical characteristics and electrical properties obtained when semiconductor material is deposited in substantially uncontaminated chambers. The fact that the introduction or diffusion, into the deposition chamber, of contaminants in the range of only a few parts per million is capable of producing semiconductor material of inferior quality, illustrates just how carefully it is necessary to seal the isolation passageway from the influx of environmental impurities.

Obviously, the less the time the deposition chambers are exposed to ambient conditions, the less contamination of those chambers will occur. Since in previous constructions, in order to gain access to the gas gate passageway, it was necessary to open the deposition chamber in which that passageway was housed, unnecessary contamination, not to mention the waste associated with lengthy periods of down-time and the expenditure of costly man-hours of labor resulted. Further, following every opening of the gas gate passageway, that passageway had to be carefully checked to be sure no leaks had developed. This leak testing procedure represented a time consuming and labor intensive effort. Due to the necessity of opening the deposition chamber, disassembling and reassembling the passageway, and leak-testing the isolation passageway, the deposition apparatus was subjected to lengthy periods of down-time. Obviously, it is desirable to minimize down-time in the mass production of any product, including these semiconductor devices. It is accordingly one of the advantages of the present invention to provide an isolation passageway module specially adapted for use with mass production-styled deposition apparatus, said passageway specifically designed to significantly reduce down-time related to the disassembly and reassembly thereof.

Due to the fact, as mentioned hereinabove, that airtight seals are required in deposition apparatus specially adapted for the continuous production of semiconductor devices, any improvement in either (1) the ability of the seal to provide a barrier between environmental contaminants and the interior sanctity of the vacuum envelope developed within the deposition apparatus, or (2) the ease of gaining access to the interior of the isolation passageway without requiring the time consuming, labor intensive effort of present resealing methodology, represents an important advance in the art. It is therefore another advantage of the present invention to provide an accessible, easily reassemblable and resealable, externally disposed, isolation passageway module.

The foregoing advantages and improvements are achieved in the external isolation module of the present invention without sacrificing the operational advantages and improvements of the gas gate passageways shown and described in patent applications Ser. Nos.: 372,937 entitled Magnetic Gas Gate; 407,983 entitled Grooved Gas Gate; and 466,995 also entitled Grooved Gas Gate (all of these applications assigned to the assignee of the instant application). More particularly, such improvements as: (1) providing a magnetically attractive force within the gas gate to urge the substrate passing therethrough toward a wall of the passageway for reducing the size of the passageway opening (the '937 patent application); (2) providing a grooved interior passageway wall for maintaining a uniform, rapidly moving flow of sweep gases through the relatively narrow, upper slot of the gas gate passageway (the '983 patent application); and (3) the use of additional sweep gas intermediate the longitudinal extent of the grooved passageway wall of the gas gate (the '995 patent application); are incorporated into the external isolation module of the instant invention. The result is an accessible, environmentally-sealed, reaction material-isolating module which is readily disposable between each pair of adjacent chambers of a deposition apparatus, said deposition apparatus constructed for the continuous production of semiconductor devices.

Recently, considerable efforts have been made to develop systems for depositing amorphous semiconductor alloys, each of which can encompass relatively large areas, and which can be doped to form p-type and n-type materials for the production of p-i-n-type devices which are, in operation, substantially equivalent to their crystalline counterparts.

It is now possible to prepare amorphous silicon semiconductor alloys by glow discharge or vacuum deposition techniques, said alloys possessing (1) acceptable concentrations of localized states in the energy gaps thereof, ahd (2) high quality electronic properties. These techniques are fully described in U.S. Pat. No. 4,226,898, entitled Amorphous Semiconductors Equivalent to Crystalline Semiconductors, Stanford R. Ovshinsky and Arun Madan which issued Oct. 7, 1980; in U.S. Pat. No. 4,217,374, Stanford R. Ovshinsky and Masatsugu Izu, which issued on Aug. 12, 1980, under the same title; and in U.S. patent application Ser. No. 423,424 entitled Method of Making Amorphous Semiconductor Alloys and Devices Using Microwave Energy, Stanford R. Ovshinsky, David D. Allred, Lee Walter and Stephen J. Hudgens. As disclosed therein, it is believed fluroine introduced into the amorphous silicon semiconductor layers operates to substantially reduce the density of the localized states and facilitates the addition of other alloying materials, such as germanium.

The concept of utilizing multiple cells, to enhance photovoltaic device efficiency, was discussed at least as early as 1955 by E. D. Jackson, U.S. Pat. No. 2,949,498 issued Aug. 16, 1960. The multiple cell structures therein discussed utilized p-n junction crystalline semiconductor devices. Essentially the concept is directed to employ different band gap devices to more efficiently collect various portions of the solar spectrum and to increase open circuit voltage ($V_{oc}$). The tandem cell device has two or more cells with the light directed serially through each cell, with a large band gap material followed by smaller band gap materials to absorb the light passed through the first cell. By substantially matching the generated currents from each cell, the overall open circuit voltage is the sum of the open circuit voltage of each cell, while the short circuit current remains substantially constant.

Hamakawa et al, reported the feasibility of utilizing Si-H in a configuration which will be defined as a cascade type multiple cell. The cascade cell is hereinafter referred to as a multiple cell without a separation or insulating layer between the cell layers thereof. Each of the cells was made of an Si-H material of the same band gap as in a p-i-n junction configuration. Matching of the short circuit current ($J_{sc}$) was attempted by increasing the thickness of the cells in the serial light path. As expected, the overall device Voc increased and was proportional to the number of cells.

Unlike crystalline silicon which is limited to batch processing for the manufacture of photovoltaic devices, amorphous silicon alloys can be deposited in multiple layers over large area substrates to form photovoltaic devices in a high volume, continuous processing system. Such continuous processing systems are disclosed in pending U.S. patent applications: Ser. No. 151,301, filed May 19, 1980 for A Method Of Making P-Doped Silicon Films and Devices Made Thereform; Ser. No. 244,386, filed Mar. 16, 1981 for Continuous Systems For Depositing Amorphous Semiconductor Material; Ser. No. 240,493, filed Mar. 16, 1981 for Continuous Amorphous Solar Cell Production System; Ser. No. 306,146, filed Sept. 28, 1981 for Multiple Chamber Deposition and Isolation System and Method; Ser. No. 359,825, filed Mar. 19, 1982, for Method and Apparatus for Continuously Producing Tandem Amorphous Photovoltaic Cells; and Ser. No. 460,629 filed Jan. 24, 1983, for Method and Apparatus For Continuously Producing Tandemn Amorphous Photovoltaic Cells. As disclosed in these applications, a substrate may be continuously advanced through a succession of deposition chambers, wherein each chamber is dedicated to the deposition of a specific semiconductor material. In making a solar cell of a p-i-n-type configuration, the first chamber is preferably dedicated for depositing a p-type semiconductor layer, the second chamber is preferably dedicated for depositing an intrinsic amorphous semiconductor layer, and the third chamber is preferably dedicated for depositing an n-type semiconductor layer. Since each deposited semiconductor layer, and especially the intrinsic semiconductor layer must be of high purity, the deposition environment in each of the deposition chambers is isolated from the constituents introduced into adjacent chambers, so as to prevent back diffusion of constituents between said deposition chambers. In the previously mentioned patent applications, wherein the systems are primarily concerned with the production of photovoltaic cells, isolation between the chambers is accomplished by "gas gates" through which unidirectional gas flow is established and through which an inert gas may be "swept" about the web of substrate material. However, such gas gates were operatively disposed interiorly of the intrinsic deposition chamber, thereby resulting in all of the aforementioned disadvantages of accessibility, difficulty of leak-testing and extended periods of down-time.

The external isolation module of the present invention substantially eliminates the foregoing disadvantages while incorporating all of the technological advances which such prior gas gates possessed. More particularly, the instant externally disposed isolation module includes a passageway (1) through which the substrate is adapted to pass, and (2) which is adapted to substantially prevent the reaction materials introduced into one of a pair of adjacent deposition chambers from contaminating the reaction materials introduced into the other chamber of the pair. A connection mechanism is specifically provided to adapt the isolation module for external connection between, and operational attachment to, the chambers of each pair of adjacent deposition chambers. And finally, in its broadest sense, each external isolation module also includes a sealing arrangement which provides a substantially air-tight barrier which substantially prevents environmental contaminants from entering the vacuum envelope. Further, a flow of sweep gas is used to substantially prevent cross-contamination of reaction materials, whereby the external isolation module of the present invention provides an accessible, environmentally-sealed, reaction material-isolating passageway between each pair of adjacent deposition chambers. The technological advance, mentioned supra, which are designed into and form part of the external isolation module include such features as (1) a grooved passageway wall for preventing stagnation of sweep gases flowing therethrough, (2) the central introduction of sweep gas into the relatively narrow channel of the passageway to further prevent back diffusion of reaction materials between adjacent deposition chambers, and (3) the use of magnetic attraction for urging the unlayered surface of the substrate toward the grooved wall of the passageway to permit a significant reduction in the height of the passageway. The isolation passageway of the instant invention therefore represents a great step forward in the field of the mass producing of amorphous semiconductor materials.

Other objects and advantages of the present invention will become clear from the drawings, the claims and the detailed description of the invention which follow.

BRIEF DESCRIPTION OF THE INVENTION

There is disclosed herein an external isolation module adapted for use with deposition apparatus in which semiconductor material is deposited onto a substrate. The deposition apparatus includes (1) a plurality of dedicated deposition chambers through which the substrate continuously travels and into which reaction materials are introduced, and (2) means for maintaining the deposition chambers and isolation modules at subatmospheric pressures to thereby form a multi-chambered vacuum envelope. The isolation module of the present invention, which is adapted to operatively interconnect pairs of adjacent deposition chambers, comprises: (1) a passageway (a) through which the substrate is adapted to pass, and (b) which is adapted to substantially prevent the reaction materials introduced into one of the pair of adjacent interconnected chambers from diffusing into the adjacent chamber of the pair: (2) connecting members which adapt the isolation module for external disposition between, and operational attachment to, the chambers of each pair of adjacent chambers; and (3) a seal adapted to form a substantially air-tight barrier for substantially preventing environmental contaminants from entering the multi-chambered vacuum envelope, whereby the external isolation module provides an accessible, environmentally sealed, reaction material-isolating passageway between each pair of adjacent chambers.

The isolation module passageway includes a pair of elongated, passageway-forming plates, said plates adapted to be spacedly positioned in substantially parallel planes for defining the passageway therebetween. The substrate passing through the passageway divides said passageway into a pair of channels. One of the plates includes means for uniformly introducing sweep gas into one of the channels and the other of the plates includes means for preventing diffusion of reaction materials through the other of the channels. The diffusion preventing means may include a pump for either (1) introducing sweep gas into, or (2) evacuating reaction materials from both of the adjacent chambers. The sweep gas may be introduced through the other of the plates at a point closer to one of the adjacent chambers than the other of the chambers. At least one of the passageway forming plates is removably positionable to provide access to the interior of the passageway. Adjacent walls of each pair of deposition chambers are apertured for the passage of the substrate therethrough. The connecting members include (1) a pair of apertured chamber connecting panels, one panel of which is adapted for attachment to one apertured chamber wall and the other panel of which is adapted for attachment to the adjacent apertured chamber wall, and (2) means for securing the passageway-forming plates to the chamber-connecting panels so as to form the passageway between each pair of adjacent deposition chambers. More particularly, each of the chamber connecting panels includes a passageway-forming, plate-receiving shoulder upon which the periphery of the removably positionable passageway-forming plate is adapted to sealingly rest. The seal is preferably elastomeric and is received in a groove formed about the periphery of the passageway-forming plates, whereby the elastomeric seals are compressed to form a substantially air-tight barrier when the passageway-forming plates are operatively disposed on the passageway-forming, plate-receiving shoulders of the passageway connecting panels.

One of the passageway-forming plates includes an aperture through which sweep gas is adapted to be introduced, from a supply of sweep gas, into the passageway. The apertured passageway-forming plate may also have sweep gas channels extending along the length of the interior surface thereof to each adjacent deposition chamber, whereby the sweep gas is directed from the aperture, to feed bores, through the channels and into each of the adjacent deposition chambers for substantially preventing the diffusion of reaction materials from one chamber into the adjacent chamber. Specifically, and in the preferred embodiment, the gas channels are formed by a plurality of spaced, parallel grooves which operatively communicate with the feed bores on one hand and the interior of each adjacent deposition chamber on the other hand. The other of the two passageway-forming plates includes a central aperture operatively connected to the pump which either (1) introduces sweep gas into each of the adjacent deposition chambers, or (2) evacuates deposition materials from those chambers.

BRIEF DESCRIPTIONS OF THE DRAWING

Figure 3:
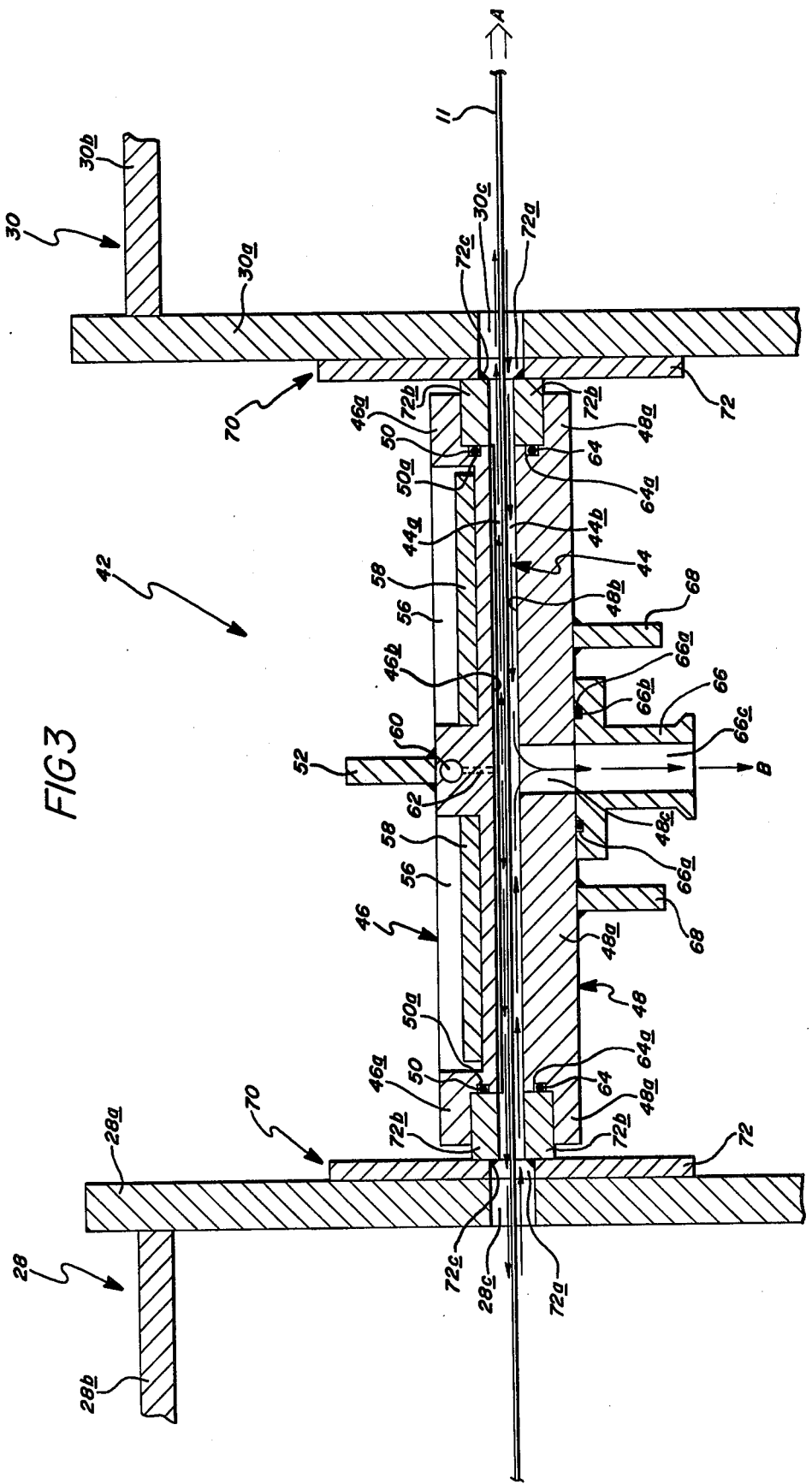
FIG. 3 is an enlarged, fragmentary, cross-sectional view taken along line 3—3 of FIG. 2 illustrating one preferred embodiment of the external isolation module of the present invention as operatively disposed between a pair of deposition chambers.

FIG. 5 is an enlarged, fragmentary, exploded perspective view, partially in cross-section, of the embodiment of the external isolation module of the present invention shown in FIG. 3; and FIG. 6 is an enlarged, fragmentary, exploded perspective view, partially in cross-section of the embodiment of the external isolation module of the present invention in which sweep gas is introduced into the manifold of a passageway-forming plate, with alternate manifold locations shown in phantom lines.

DETAILED DESCRIPTION OF THE DRAWINGS

I. The Photovoltaic Cell

Figure 1:
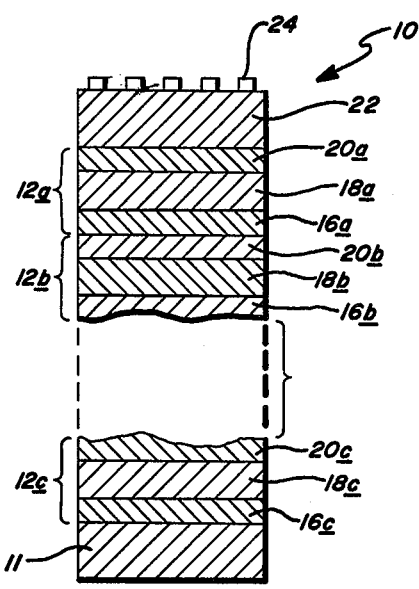
FIG. 1 is a fragmentary, cross-sectional view of the tandem photovoltaic cell comprising a plurality of p-i-n-type cells, each layer of the cells formed from a semiconductor alloy.

Referring now to the drawings and particularly to FIG. 1, a photovoltaic cell formed of a plurality of successive p-i-n layers, each of which includes an amorphous semiconductor alloy, is shown generally by the numeral 10. It is primarily for the production of this type of photovoltaic device, wherein semiconductor layers are continuously deposited onto a moving substrate in successive, isolated deposition chambers, that the external isolation module of the present invention was developed.

More particularly, FIG. 1 shows a p-i-n-type photovoltaic device such as a solar cell made up of individual p-i-n-type cells 12a, 12b and 12c. Below the lowermost cell 12a is a substrate 11 which may be transparent or formed from a metallic material such as stainless steel, aluminum, tantalum, molybdenum or chrome. Although certain applications may require a thin oxide layer and/or a series of base contacts prior to application of the semiconductor material, for purposes of this application, the term "substrate" shall include not only a flexible film, but also any elements added thereto by preliminary processing.

Each of the cells 12a, 12b and 12c are fabricated with a semiconductor body containing at least a silicon or germanium alloy. Each of the semiconductor bodies includes an n-type conductivity region or layer 20a, 20b and 20c; an intrinsic region or layer 18a, 18b and 18c; and a p-type conductivity region or layer 16a, 16b, and 16c. As illustrated, cell 12b is an intermediate cell and, as indicated in FIG. 1, additional intermediate cells may be stacked atop the illustrated cells without departing from the spirit or scope of the present invention. Also, although p-i-n cells are illustrated, the external isolation module of this invention may also be used with apparatus adapted to produce single or multiple n-i-p cells.

It is to be understood that following the deposition of the semiconductor alloy layers, a further deposition process may be either performed in a separate environment or as a part of a continuous process. In this step, a TCO (transparent conductive oxide) layer 22 is added. An electrode grid 24 may be added to the device where the cell is of a sufficiently large area, or if the conductivity of the TCO layer 22 is insufficient. The grid 24 is adapted to shorten the carrier path and increase the conduction efficiency.

II. The Multiple Glow Discharge Deposition Chambers

Figure 2:
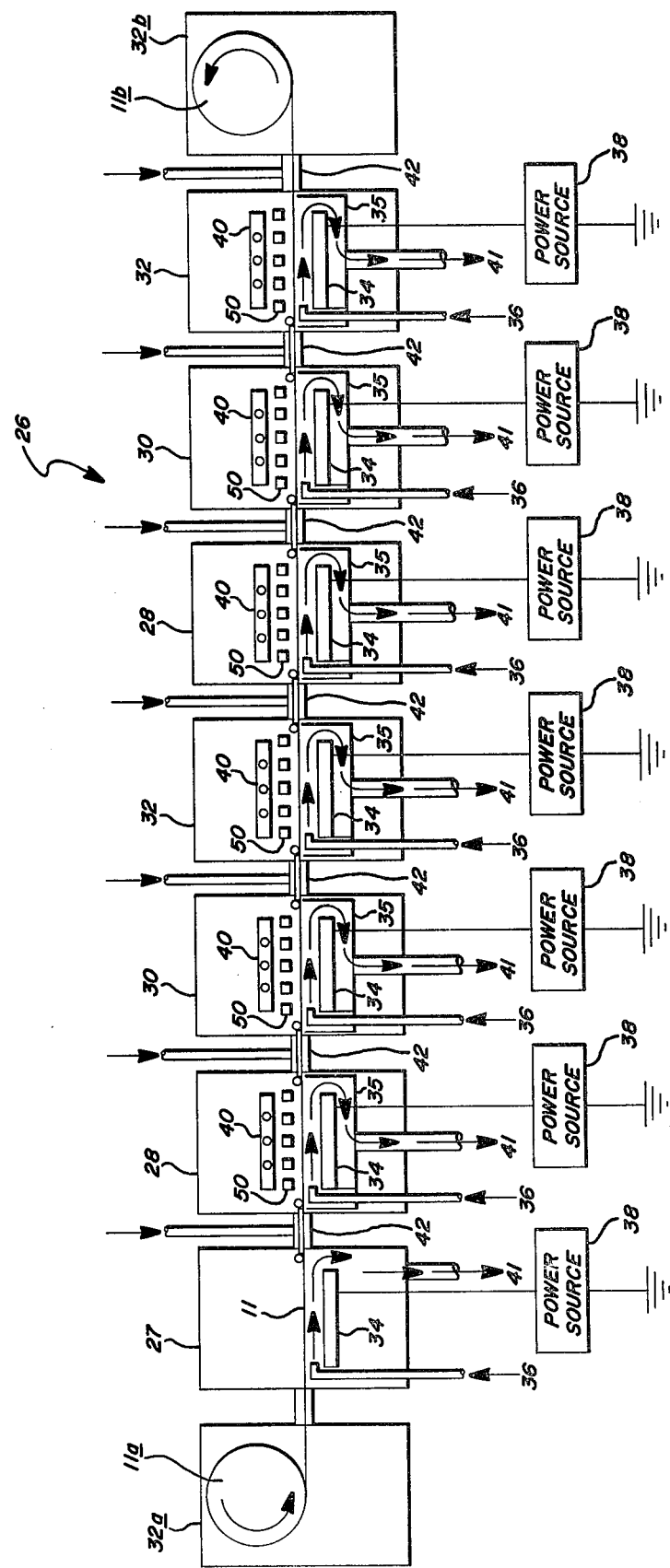
FIG. 2 is a diagrammatic representation of multiple glow discharge chamber deposition apparatus adapted for use in the continuous production of photovoltaic devices such as the cells shown in FIG. 1, and incorporating the external isolation module of the present invention between adjacent chambers.

Turning now to FIG. 2, a diagrammatic representation of a multiple glow discharge chamber deposition apparatus for the continuous production of photovoltaic cells is generally illustrated by the reference numeral 26. The continuous deposition apparatus 26 includes a plurality of isolated, dedicated deposition chambers, each deposition chamber of which is shown interconnected by an external isolation module, generally 42, through which sweep gases and a web of substrate material are adapted to pass. An external isolation module 42 is also operatively disposed, in the preferred embodiment, between the chambers of the apparatus which are not adapted to deposit semiconductor material, but which cannot be allowed to contaminate the deposition chambers adjacent thereto. It should be apparent to one of ordinary skill in the art that the isolation modules of the present invention can be use to operatively interconnect every pair of chambers in a given apparatus, or to interconnect only pairs of chambers between which contamination is of the greatest concern.

The deposition apparatus 26 is specifically adapted to deposit, on a mass production basis, large area photovoltaic cells having a p-i-n-type configuration, onto the deposition surface of a web of substrate material 11 which is continually fed therethrough. In order to deposit the semiconductor layers required for producing multiple p-i-n-type cells, the deposition apparatus 26 must include at least one triad of deposition chambers. Although at least two triads is preferred (and therefore six dedicated deposition chambers are illustrated in FIG. 2), additional triads may be employed without departing from the spirit and scope of this invention. Each triad of deposition chamber comprises: a first deposition chamber 28 in which a p-type conductivity semiconductor layer is deposited onto the deposition surface of the substrate 11 as the substrate 11 passes therethrough; a second deposition chamber 30 in which an intrinsic amorphous semiconductor layer is deposited atop the p-type semiconductor layer on the deposition surface of the substrate 11 as the substrate 11 passes therethrough; and a third deposition chamber 32 in which an n-type conductivity semiconductor layer is depositied atop the intrinsic layer on the deposition surface of the substrate 11 as the substrate 11 passes therethrough. It should be apparent that (1) although two triads of deposition chambers have been illustrated, fewer or additional triads, or additional individual chambers may be added to the apparatus to provide a machine having the capability of producing photovoltaic cells comprising any number of semiconductor layers; (2) the external isolation module of the present invention is applicable to any machine in which (a) gases are fed into each of a plurality of adjacent, isolated chambers and (b) those gases must be confined to a specific region within each of those chambers; and (3) although the glow discharge deposition process illustrated herein employs an r.f. powered cathode, other glow discharge techniques (such as microwave power) may be employed without departing from the spirit of the present invention.

Each deposition chamber 28, 30 and 32 of each triad is adapted to deposit a single semiconductor layer onto the substrate 11. To that end, each of the deposition chambers 28, 30 and 32 of each triad of chambers includes: a cathode 34; a shield 35 disposed about each of the cathodes 34; a process gas supply conduit 36; a power source 38; an unused process gas and nondeposited plasma evacuation conduit 41; a plurality of transversely extending magnetic elements 50; and a plurality of radiant heating elements, shown schematically as 40 in FIG. 2. A sweep gas conduit, although not shown, may additionally be provided in certain of the deposition chambers to introduce sweep gas in a direction opposite to the direction of flow of possible contaminants from an adjacent chamber.

The supply conduits 36 are operatively associated with the respective cathodes 34 to deliver process gas mixtures to the decomposition regions created in each deposition chamber between said cathodes 34 and the substrate 11. The cathode shields 35 are adapted to operate in conjunction with the web of substrate material 11, the cathode 34 and the evacuation conduit 41 to substantially confine the decomposed species within the decomposition region of the deposition chambers.

The power sources 38 can be radio frequency generators which operate in conjunction with the cathodes 34, the radiant heaters 40 and the grounded substrate 11 to disassociate the reaction gases entering the decomposition region of the deposition chambers into deposition species. The decomposed species are then deposited onto a surface of the substrate 11 as a semiconductor layer. The substrate 11, preferably formed of magnetic material, is maintained substantially flat by the plurality of rows of magnetic elements 50 which provide an attractive force urging the magnetic substrate 11 upwardly, out of its normal sagging path of travel.

To form the photovoltaic cell 10 illustrated in FIG. 1, a p-type semiconductor layer is deposited onto the substrate 11 in the deposition chamber 28 of each triad of chambers, an intrinsic amorphous semiconductor layer is deposited atop the p-type layer in the deposition chamber 30 of each triad of chambers, and an n-type semiconductor layer is deposited atop the intrinsic layer in the deposition chamber 32 of each triad chambers. As a result, the apparatus 26 is adapted to deposit at least six semiconductor layers onto the substrate 11, wherein the intrinsic layer, deposited in deposition chambers 30, differs in composition from the layers deposited in deposition chambers 28 and 32 by the absence (in quantitatively significant amounts) of at least one element which will be referred to as the dopant or doping species.

It is important that each semiconductor layer deposited onto a surface of the substrate 11, in order to produce high efficiency photovoltaic devices, be of high purity, of homogeneous composition across said substrate surface and of uniform thickness across said substrate surface. In order to achieve these objectives, inter alia, it is necessary to substantially prevent the cross-contamination of process gases from one chamber of a pair of deposition chambers into the adjacent chamber. It is further necessary to prevent the influx of environmental contaminants into the vacuum envelope that is formed by the deposition apparatus 26. It is to prevent the foregoing contamination in a manner which will also reduce (1) the loss of production time, and (2) the expenditure of excessive labor-intensive activities that the external isolation module 42 of the present invention was developed.

III. The External Isolation Module

Referring now to FIGS. 3 and 5, the external isolation module is shown in a greatly enlarged, cross-sectional view by the numeral 42 as operatively disposed between and interconnecting a pair of adjacent deposition chambers such as chambers 28 and 30. Each chamber 28 and 30 includes an exterior side wall 28a and 30a, an exterior top wall 28b and 30b, and an elongated aperture, 28c and 30c, through which the web of substrate material 11 is adapted to pass in the direction of arrow A. Note, while the foregoing description involved chambers 28 and 30, these chambers were only selected as examplary. The external isolation module 42 of the present invention is similarly adapted for use not only between any other pair of adjacent chambers in the deposition system 26 of FIG. 2, but between any pair of adjacent chambers wherein reaction materials must be separated. Variations of the FIG. 3 embodiment, employed to provide additional protection against contamination, will be discussed with reference to FIG. 6.

The isolation module 42 includes an elongated, relatively small passageway 44 (1) through which the web of substrate material 11 is adapted to pass, and (2) which is adapted to substantially prevent the reaction materials introduced into one of a pair of interconnected deposition chambers from diffusing into the adjacent chamber. The preferred length of the passageway 44 has been optimized at approximately 16 inches, although (1) passageways half that length effectively reduce cross-contamination, and (2) longer passageways may be used without appreciable gains in the prevention of contamination. The width of the passageway 44 is at least equal to the width of the web of substrate material 11 and the height of the passageway 44 is as small as 1/16 inch. The width is selected to provide the smallest possible opening through which reactant materials introduced into one of the chambers 28 and 30 can diffuse to the adjacent chamber, while providing a sufficiently large opening for passing the web of substrate material and the semiconductor material deposited onto the substrate therethrough without that semiconductor material contacting and being damaged by the interior wall of the passageway 44. When the web of substrate material 11 is operatively disposed in the deposition apparatus 26, the passageway 44 is divided into two compartments, (1) a relatively wide, elongated, lower channel 44b; and (2) a relatively narrow, elongated, upper channel 44a. Depending on the embodiment, either (1) a sufficient flow of sweep gas must be maintained through both of these channels, or (2) a sufficient flow of sweep gas must be maintained through the upper chamber 44a and a sufficient flow of exiting reaction materials must be maintained through the lower chamber 44b to substantially prevent diffusion of reaction materials through the passageway 44.

The passageway 44 is formed by a pair of elongated passageway-forming plates 46 and 48 adapted to be spacedly supported in substantially parallel, generally horizontal planes. In the first preferred embodiment of FIGS. 3 and 5, both of the elongated plates 46 and 48 are adapted to be removably disposed for operatively interconnecting the adjacent deposition chambers 28 and 30. In the other preferred embodiment, discussed hereinafter with respect to FIG. 4, one of the plates, 46 or 48, may be fixedly disposed relative to those chambers. The periphery 46a of the passageway-forming plate 46 is stepped to provide an interiorly disposed, plate-positioning and sealing surface, as will be further detailed hereinafter. The stepped periphery 46a of the plate 46 is grooved as at 50a for the reception therein of an elongated O-ring-type elastomeric seal 50 which provides a barrier to prevent the entrance of environmental contaminants into the passageway 44. The interior surface 46b of the elongated passageway-forming plate 46 has a plurality of longitudinally extending grooves 46c (best shown in FIG. 5) formed therein, said grooves 46c adapted to extend substantially the entire length of the plate 46 so as to substantially span the distance between, and operatively communicate with both of, the chambers 28 and 30 for the purpose of insuring that a sufficient velocity of sweep gas flows through the upper passageway slot 44a to prevent diffusion of reaction gases between adjacent chambers (this concept is fully described in previously referred to U.S. patent applications Ser. Nos. 407,983 and 466,955).

Centrally disposed and transversely extending (relative to the direction of substrate movement) is an upstanding ridge 52 which has a plurality of apertures 54 formed therethrough, the ridge 52 and apertures 54 adapted to provide a handle for grasping and removably lifting and repositioning the passageway-forming plate 46. A plurality of elongated, relatively deep, magnet-receiving cavities 56 extend from either side of the upstanding ridge 52. The depth dimension of the cavities 56 is selected so that ceramic magnets 58, when operatively inserted thereinto, will be disposed sufficiently close to the interior grooved wall 46b of the passageway 44 to (1) magnetically attract the magnetic web of substrate material 11 passing through that passageway 44, and (2) urge the substrate material toward that interior grooved wall 46b, as fully disclosed in previously mentioned U.S. patent application Ser. No. 372,937. Finally, an elongated, transversely extending, sweep gas-receiving bore 60 supplies sweep gas (preferably an inert gas such as argon) from a supply (not shown) to feed-bores 62 which operatively communicate the bore 60 with each of the grooves 46c, whereby the sweep gas may be uniformly introduced into each groove 46c of the upper passageway surface.

In the embodiment depicted in FIGS. 3 and 5, the periphery 48a of the passageway-forming plate 48 is stepped to provide an interiorly disposed, positioning and sealing surface 48a, as will be further detailed hereinafter. The stepped, periphery 48a of the plate 48 is grooved as at 64a for the reception therein of an elongated O-ring-type elastomeric seal 64, the function of which was described hereinabove relative to passageway-forming plate 46 and seal 50. The interior of the passageway-forming plate 48 is a substantially planar, smooth surface 48b. Centrally disposed on and sealingly affixed to the exterior surface of the plate 48 is a relatively large, circular nozzle 66 adapted for connection to a pump 80 and an exhaust 82 (see FIG. 6) for either (1) withdrawing reaction materials through the lower passageway channel 44b from both deposition chambers 28 and 30, or (2) introducing sweep gas into the lower passageway channel 44b to both deposition chambers. The nozzle 66 includes a groove 66a for receiving an O-ring type elastomeric seal 66b. The seal 66b is adapted to prevent leakage past the junction defined between the exterior surface of the plate 48 and the nozzle 66. The interior bore 66c of the nozzle 66 is aligned with a central plate bore 48c either for completing the flow path of (1) inert sweep gas from the exhaust 82, through the lower passageway channel 44b and into the chambers 28 and 32 as shown by arrow C in FIG. 6; or (2) reaction gas(es) from the chambers through the passageway channel 44b and to the exhaust 82 as shown by arrow B in FIG. 3. Finally, a pair of transverse (relative to the direction of substrate movement), apertured ridges 68 extend across the exterior surface of the passageway-forming plate 48 for providing a handle for grasping, inserting and removing the plate 48.

Note that, as mentioned in the previous discussion, the nozzle 66 and pump 80 are adapted to be employed as desired to either (1) evacuate reaction materials through the lower passageway channel 44b into the chambers, or (2) introduce sweep gas from a source 84 through the lower passageway channel 44b and into the chambers (see FIG. 6). In either case, reaction materials are substantially prevented from diffusing from one chamber into the adjacent chamber. Where the pump 80 is employed in its evacuation mode of operation, the reaction materials from both chambers are withdrawn through the nozzle 66 and exhausted. And where the pump 80 is employed in its sweep gas introduction mode of operation, the flow of sweep gas from the source 84 prevents the diffusion of reaction materials. It is only necessary to perform minor modifications of the interior surface of the passage-forming plate 48 of FIGS. 3 and 5 to adapt the nozzle and pump assembly for the introduction of sweep gas from the gas source 84. More particularly and with reference to FIG. 6, an elongated groove 86 is formed in the interior surface of the modified passageway-forming plate 48 for receiving therein an elongated, apertured sweep gas manifold 88. The manifold 88 includes a plurality of small apertures such as 88a along the length thereof for uniformly introducing the sweep gas along the transverse extent of the lower passageway channel 44b. A tube 88b provides the operative connection between the nozzle 66 and the manifold 88 to direct sweep gas through the aperture 88a therein. FIG. 6 further illustrates, in phatom lines, alternate positions at which the interior surface of the modified passageway-forming plate 48a may be grooved to receive the manifold 88. The reasons for providing numerous positioning grooves 86 will be detailed in the "operation" section of this application.

The external isolation module 42 of the present invention also includes a connecting assembly, generally 70, for operatively connecting the passageway-forming plates 46 and 48 between adjacent deposition chambers such as 28 and 30. The connecting assembly 70 comprises a pair of chamber-connecting panels 72, each having a centrally located, transversely elongated slot 72a formed therethrough. The length of the slots 72a is substantially equal to the width of the web of substrate material 11 so that substrate material is able to pass therethrough. The height of the slots 72a is substantially equal to, but slightly greater than, the height of the passageway 44. One of the chamber-connecting panels 72 is adapted to be attached to one of the walls, 28a or 30a, of the chambers 28 or 30 so as to align the slots 72a with the elongated apertures 28c and 30c of the chamber walls. Each of the chamber-connecting panels 72 includes a pair of passageway-forming, plate-receiving shoulders 72b upon which two opposed sides of the stepped periphery 46a and 48a of the removably positionable, passageway-forming plates 46 and 48 are adapted to sealingly rest.

The isolation module 42 further includes front and rear walls (only the rear wall 73 of which is shown in FIG. 5). Each of the front and rear walls include an elongated bar 75 having a height dimension equal to the distance between the outer surface of shoulders 72b. As should be readily apparent, the upper surface 75b of bar 75 provides a plate-receiving shoulder for the sides of the stepped periphery 46a of plate 46, which are not supported by shoulders 72b of the panels 72, and the lower surface 75c of bar 75 provides a plate-receiving shoulder for the sides of the stepped periphery 48a of plate 48 which are not supported by shoulders 72b of the panels 72.

The plate-receiving shoulders 72b are secured as by weldments 72c to the chamber-connecting panels 72 in such a spatial relation that the stepped periphery 46a and 48a of the passageway-forming plates 46 and 48, respectively, when positioned upon the shoulder 72b and bars 75b and 75c, will define a passageway 44 of optimum height. More particularly, with each of the chamber-connecting panels 72 secured to one of the walls 28a or 30a of the chambers 28 or 30, the passageway-forming plates 46 or 48 are placed upon the oppositely disposed plate-receiving shoulders 72b and oppositely disposed shoulders 75b and 75c of the bars 75, in such a manner that the elastomeric seals 50 and 64 in the stepped periphery 46a and 48a of the plates 46 and 48 are compressed to form a leak-proof barrier past which environmental contaminants are unable to flow. When the apparatus 26 is operational, the subatmospheric pressure developed within the vacuum envelope creates a force which sealingly holds the passageway-forming plates 46 and 48 firmly against the shoulders 72b. When so operatively disposed, the apertures formed between the spaced shoulders 72b, and the passageway 44 are in alignment for the passage of the layered web of substrate material 11 therethrough. Upon deactivation of the pumping assembly, the passageway-forming plates 46 and 48 may be readily removed from the shoulders 72b to provide access to the interior of the isolation module 42 for purposes of cleaning, modifying the interior of the module, etc.

Figure 4:
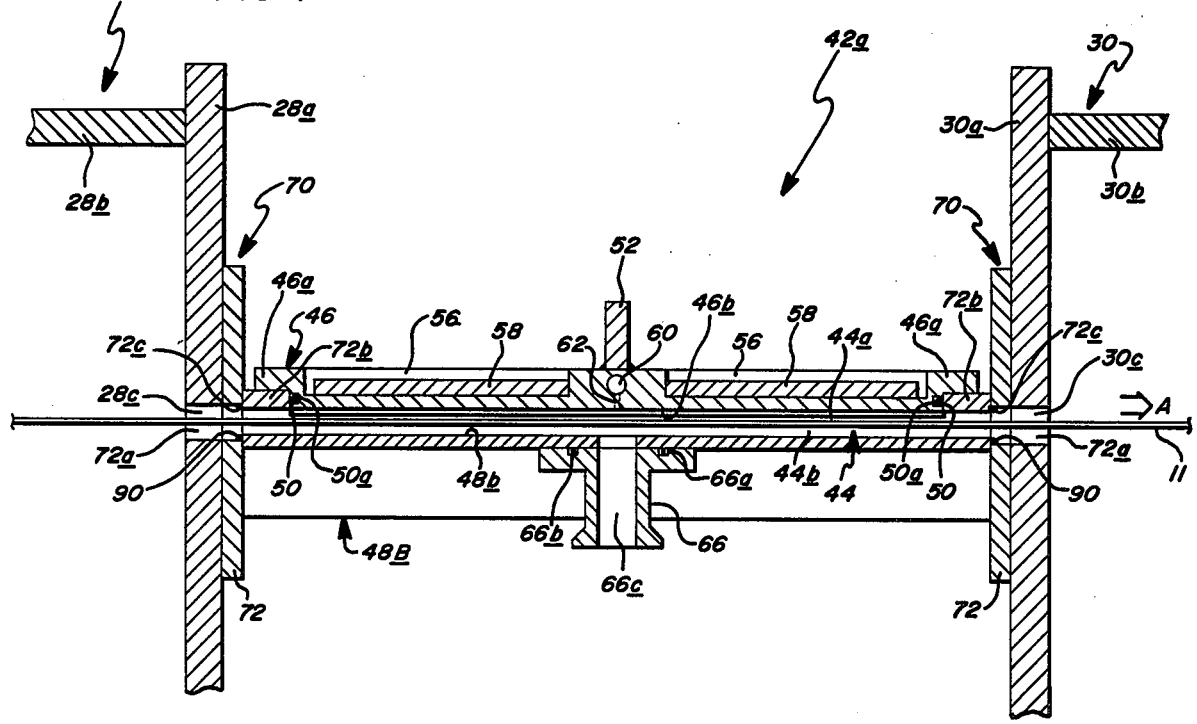
FIG. 4 is an enlarged, fragmentary, cross-sectional view taken along line 4—4 of FIG. 2 and illustrating a second embodiment of the external isolation module of the present invention as operatively disposed between a pair of adjacent deposition chambers.

Turning now the the embodiment illustrated in FIG. 4, the external isolation module, generally 42a, will be described with the parts thereof which are substantially identical to the parts specified above, referenced by the same numerals. The FIG. 4 embodiment depicts an external isolation module 42a in which the lower passageway-forming plate 48b is nonremovably supported by the panels 72 of the connecting assembly 70 for operatively interconnecting the adjacent chambers 28 and 30. In this embodiment the nonremovable lower plate 48B is welded as at 90 to the connecting panels 72 in such alignment with the slots 72a in the connecting panels 72 and the elongated apertures 28c and 30c in the chamber walls 28a and 30a that the interior surface 48b of the plate 48B forms the bottom surface of the passageway 44. The upper, removable passageway-forming plate 46 is identical to the plate of the FIG. 3 embodiment and is adapted (1) to be sealingly positioned on the plate-receiving shoulders 72b of the connecting assembly 70 and (2) to have sweep gas introduced through the central bore 60 thereof and feed bores 62 thereof into each of the grooves 46c formed in the interior surface thereof. It should be apparent that the nozzle 66 may be secured, at any desired location, to the exterior surface of the plate 48B for either providing for (1) the introduction of sweep gas into, or (2) the evacuation of reaction materials from the adjacent chambers 28 and 30 which the external isolation module 42a interconnects.

IV. Operation

The external isolation module 42 of the present invention, regardless of the embodiment selected for operative deployment within the deposition apparatus 26 of FIG. 2, is adapted to be disposed between either selected (1) adjacent deposition chambers 28, 30 and 32, or (2) between a deposition chamber and another chamber of the apparatus. Even though the modules 42 may therefore be used between any two chambers, there are certain locations at which it is of the greatest importance to deploy those modules 42. The most important location is on either side of the intrinsic deposition chambers 30 so that dopant gases do not contaminate the intrinsic reaction materials. Other important locations are between: (1) any preliminary cleaning, storage, or other pre-deposition processing chambers and the first deposition chamber, such as between cleaning chamber 27 and the first p-layer deposition chamber 28 of FIG. 2; (2) the final deposition chamber of a preeceding cell and the first deposition chamber of the succeeding cell, such as between the n-layer dopant deposition chamber 32 of the first triad of chambers and the p-layer dopant deposition chamber 28 of the second triad of chambers of FIG. 2; (3) the final deposition chamber and any post deposition turning or storage chamber, such as between the n-layer dopant deposition chamber 32 of the second triad of chambers and the take-up chamber 32b. Although it is preferred that the isolation module 42 be employed wherever isolation of reaction materials is required, it is possible to deploy internal gas gates, such as those depicted in previously discussed patent applications, between chambers of the deposition apparatus 26 other than the intrinsic deposition chambers.

In operation, the connecting panels 72 of the connecting assembly 70 are secured to the opposite, adjacent walls 28a and 30a of deposition chambers such as 28 and 30 so that the elongated apertures 28c and 30c of the chamber walls 28a and 30a are aligned with the panel slots 72a and the opening defined between elongated shoulders 72b. In the removable embodiment, the stepped periphery 46a and 48a of the passageway-forming panels 46 and 48 are then securedly positioned to rest upon and have the elastomeric seals 50 and 64, respectively, thereof compressed by the plate-receiving shoulders 72b. Upon initiation of vacuum pumping, the plates 46 and 48 are sealingly pulled against the shoulders 72b to prevent environmental contaminants from seeping therepast and entering the chambers 28 and 30. Sweep gas is then introduced into the grooves 46c of the upper-passageway forming plate 46 through the feed bores 62 and aperture 60 for maintaining a sufficient flow rate to prevent the diffusion of reaction materials through the relatively narrow passageway channel 44a. The pump 80 is finally activated to prevent diffusion of reaction materials through the relatively wide lower channel 44b either by (1) evacuating those reaction materials through the bore 66c of the nozzle 66 which is secured to the lower passageway-forming plate 48, or (2) introducing sweep gas from the gas source 84 to flow into both of the adjacent chambers through the apertured manifold 88.

When the sweep gas introduction mode of operation is employed, the operator can choose the location at which to deploy the manifold 88. Although commonly deployed approximately midway between the adjacent chambers, the manifold 88 may be operatively disposed at a point closer to one of the chambers than the other depending upon the direction from which contamination is of the greatest concern. Accordingly, a plurality of lower passageway-forming plates 48A, each with a groove 86 formed at a different point on the interior surface 48b thereof, may be available. The operator then selects the plate having the manifold activated at the proper location to introduce sweep gas into the relatively wide passageway channel 44b.

Regardless of whether the (1) stationary low plate 48B or removable lower plate 48 embodiment, or (2) introduction of sweep gases or withdrawal of reaction material embodiment is employed, the external isolation module of the present invention effectively prevents the diffusion of reaction materials from one deposition chamber into the adjacent chamber while providing a reliable, accessible, environmentally-sealed passageway between those adjacent chambers.

It should be understood that the present invention is not limited to the precise structure of the illustrated embodiments. It is intended that the foregoing description of the presently preferred embodiments be regarded as an illustration rather than as a limitation of the present invention. It is the claims which follow, including all equivalents, which are intended to define the scope of this invention.

What is claimed is:

1. An external isolation module for use with deposition apparatus adapted to deposit semiconductor material onto a substrate; said deposition apparatus including: a plurality of chambers through which the substrate is moved, and into at least one of which reaction materials are introduced; and means for maintaining the chambers at sub-atmospheric pressures to form a multi-chambered vacuum envelope; said isolation module, which is adapted to operatively interconnect at least one pair of adjacent chambers, comprising;

passageway means including a pair of spacedly positioned passageway-forming members (1) through which a substrate is adapted to pass, and (2) which is adapted to substantially prevent the reaction materials introduced into one of the pair of interconnected chambers from diffusing into the adjacent chamber; at least one of said passageway-forming members being removably positionable to provide access to the interior of the passageway means without dissassembly of the chambers;

connecting means adapting the isolation module for external disposition between, and operational securement to, each chamber of the pair of adjacent chambers; and sealing means adapted to provide a leak-proof seal to substantially prevent environmental contaminants from entering the vacuum envelope, whereby the externally-interconnected isolation module provides an accessible, environmentally-sealed, reaction material-isolating passageway between the pair of adjacent chambers.

2. Apparatus as in claim 1, wherein the passageway-forming members comprise a pair of passageway-forming plates.

3. Apparatus as in claim 2, wherein the passageway-forming plates are adapted to be spacedly disposed in substantially parallel planes.

4. Apparatus as in claim 2, wherein one of the passageway-forming plates is fixed, and the other of the passageway-forming plates is removably positionable to provide access to the interior of the passageway means.

5. Apparatus as in claim 4, wherein adjacent chamber walls are apertured for passage of the substrate therethrough; and the connecting means includes: a pair of slotted, chamber-connecting panels, one panel of which is adapted to be attached to one apertured chamber wall, and means for securing the removable passageway-forming plate to the chamber-connecting panels so as to form the passageway means between the pair of adjacent chambers.

6. Apparatus as in claim 5, wherein each of the chamber-connecting panels includes a passageway-forming, plate-receiving shoulder upon which the periphery of the removably positionable, passageway-forming plate is adapted to sealingly rest.

7. Apparatus as in claim 6, wherein the sealing means include at least one elastomeric seal; and the periphery of the passageway-forming plate is grooved for receiving therein said elastomeric seal, whereby the elastomeric seal is compressed to form a leak-proof barrier when the removable passageway-forming plate is operatively disposed upon the passageway-forming, plate-receiving shoulders of the chamber connecting panels.

8. Apparatus as in claim 4, wherein one of the passageway-forming plates includes aperture means through which sweep gas may be introduced into the passageway means; a supply of sweep gas; and means for introducing said sweep gas from the supply through the aperture means and into the passageway means.

9. Apparatus as in claim 8, wherein the apertured passageway-forming plate includes sweep gas-channelling means extending along the length of the interior surface thereof to each chamber, whereby the sweep gas is directed from the aperture means through the channeling means, and into both of the adjacent chambers for substantially preventing diffusion from one chamber into the adjacent chamber.

10. Apparatus as in claim 9, wherein the gas channelling means includes a plurality of spaced, parallel grooves which extend from both sides of the central aperture to operatively communicate with each of the adjacent apertured connecting panels and apertured chamber walls; and the aperture means includes a bore communicating with each of the grooves.

11. Apparatus as in claim 9, wherein the other of the passageway-forming plates includes a central aperture; and pump means operatively connected to the central aperture for evacuating each of the pair of adjacent chambers.

12. Apparatus as in claim 9, wherein the other of the passageway-forming plates includes a central aperture; a supply of sweep gas; said pump means adapted to introduce sweep gas from the supply through the central aperture of the other of the plates and into the passageway.

13. Apparatus as in claim 2, wherein both of the passageway-forming plates are removably positionable to provide access to the interior of the passageway means.

14. Apparatus as in claim 13, wherein adjacent chamber walls are apertured for passage of the substrate therethrough; and the connecting means includes: a pair of apertured, chamber-connecting panels, each panel of which is adapted to be attached to one apertured wall of the adjacent chambers, and means for securing the passageway-forming plates to the chamber-connecting panels so as to form the passageway means between the pair of adjacent chambers.

15. Apparatus as in claim 14, wherein each of the chamber-connecting panels includes a pair of spaced, passageway-forming, plate-receiving shoulders upon which the periphery of the passageway-forming plates are adapted to sealingly rest.

16. Apparatus as in claim 15, wherein the sealing means includes at least one elastomeric seal; and the periphery of the passageway-forming plates are grooved for receiving therein said elastomeric seal, whereby the elastomeric seal of each passageway-forming plate is compressed to form a leak-proof barrier when the passageway-forming plates are operatively disposed upon the passageway-forming, plate-receiving shoulders of the chamber connecting panels.

17. Apparatus as in claim 13, wherein one of the passageway-forming plates includes aperture means through which sweep gas may be introduced into the passageway means; a supply of sweep gas; and means for introducing said sweep gas from the supply through the aperture means and into the passageway means.

18. Apparatus as in claim 17, wherein the apertured passageway-forming plate includes sweep gas-channelling means extending along the length of the interior surface thereof to each chamber, whereby the sweep gas is directed from the aperture means, through the channelling means, and into both of the adjacent chambers for substantially preventing diffusion from one chamber into the adjacent chamber.

19. Apparatus as in claim 18, wherein the gas channelling means includes a plurality of spaced, parallel grooves which extend from both sides of the central aperture to operatively communicate with each of the adjacent apertured connecting panels and apertured chamber walls; and the aperture means includes a bore communicating with each of the grooves.

20. Apparatus as in claim 18, wherein the other of the passageway-forming plates includes a central aperture; and pump means operatively connected to the central aperture for evacuating each of the pair of adjacent chambers.

21. Apparatus as in claim 18, wherein the other of the passageway forming plates includes a central aperture; a supply of sweep gas; said pump means adapted to introduce sweep gas from the supply through the central aperture of the other of the plates and into the passageway.

* * * * *